(12) United States Patent  
Hiwatashi

(10) Patent No.: US 6,997,737 B2
(45) Date of Patent: Feb. 14, 2006

(54) SOLDERING STRUCTURE BETWEEN A TAB OF A BUS BAR AND A PRINTED SUBSTRATE

(75) Inventor: Hirokazu Hiwatashi, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 10/898,183

(22) Filed: Jul. 26, 2004

(65) Prior Publication Data
US 2005/0048825 A1 Mar. 3, 2005

(30) Foreign Application Priority Data
Aug. 26, 2003 (JP) ............................. 2003-301935

(51) Int. Cl.
*H01R 13/58* (2006.01)
(52) U.S. Cl. ...................... 439/474; 439/721; 439/949; 439/82; 439/83; 439/876
(58) Field of Classification Search ................ 439/246, 439/474, 76.1, 76.2, 949, 212, 81–83, 736, 439/721, 876
See application file for complete search history.

(56) References Cited

U.S. PATENT DOCUMENTS 4,193,660 A * 3/1980 Jaconette .................... 439/752
4,558,912 A * 12/1985 Coller et al. ................ 439/246
5,984,691 A * 11/1999 Brodsky et al. .............. 438/66

FOREIGN PATENT DOCUMENTS

JP   A 10-189085   7/1998
JP   A 2000-22353   1/2000

* cited by examiner

*Primary Examiner*—Tho D. Ta
(74) *Attorney, Agent, or Firm*—Oliff & Berridge, PLC

(57) ABSTRACT

A soldering structure between a tab of a bus bar and a printed substrate is disclosed to provide a soldering structure between a tab of a bus bar and a printed substrate that causes no crack. An electrical conductive material is formed on a printed substrate. A tab through-hole is provide to penetrate the electrical conductive material and printed substrate. A tab formed by bending a body of the bus bar enters the tab through-hole. A periphery of the tab and the electrical conductive material are interconnected by soldering. A stress-absorbing aperture or recess is provided in an insulation plate on which the body of the bus bar is mounted. The stress-absorbing aperture or recess can absorb an axial stress caused in the tab.

1 Claim, 2 Drawing Sheets

SOLDERING STRUCTURE BETWEEN A TAB OF A BUS BAR AND A PRINTED SUBSTRATE

CLAIM FOR PRIORITY

This invention relates to subject-matter contained in and claims priority to JP 2003-301935, filed on Aug. 26, 2003, the entire disclosure of which is incorporated herein by reference thereto.

BACKGROUND OF THE INVENTION

1. Field of Invention

This invention relates to a soldering structure between a tab of a bus bar and a printed substrate. More particularly, in the case where the printed substrate and bus bar are contained in a layered manner in an electrical junction box to be mounted on an automobile vehicle, and where the tab of the bus bar is soldered on an electrical conductive material on the printed substrate so that the tab intersects the electrical conductive material in a vertical direction, the soldered portion can be prevented from causing cracks.

2. Description of Related Art

As electrical components to be mounted on an automobile vehicle increase, a printed substrate constituting an ECU (Electronic Control Unit) together with bus bars are contained in the electrical junction box and they are electrically connected to form high density circuits.

FIG. 4 shows a typical connection between an electrical conductive material on a printed substrate and a bus bar in a casing of an electrical junction box. A printed substrate 3 is located in a layered manner above or below a bus bar 2 secured on an insulation plate 1 in a horizontal direction. A tab 2b is formed by bending a body 2a of the bus bar 2 in a vertical direction. The tab 2b enters a tab through-hole 5 formed in an electrical conductive material 4 and the printed substrate 3. A solder 6 electrically interconnects the tab 2b and the electrical conductive material 4 around the tab through-hole 5. See Japanese Patent Public Disclosure 2000-22353.

When the solder 6 interconnects the tab 2b and electrical conductive material 4, the tab 2b made of a brass plate is different from the solder 6 with respect to coefficients of extension at a high temperature. The printed substrate 3 on which the solder 6 interconnects the tab 2b and electrical conductive material 4 is secured to a casing of the electrical junction box by using screws. When the tab 2b extends at a high temperature, a stress is caused in an axial direction in the soldered portion. If this stress increases, the soldered portion between the tab 2b and the electrical conductive material 4 tends to cause cracks.

In order to overcome the above problem, in many cases, a connector connected to the electrical conductive material is attached to the printed substrate and the tab of the bus bar is mated with a female terminal in the connector. See Japanese Patent Public Disclosure HEI 10-1890855 (1998).

However, this connecting means using the connector will increase the number of components and working steps and will further bring the ECU and printed substrate into a large size.

In view of the above problems, an object of the invention is to provide a soldering structure between a tab of a bus bar and a printed substrate that causes no crack.

SUMMARY OF THE INVENTION

In order to achieve the above object, the invention is directed to a soldering structure between a tab of a bus bar and a printed substrate. In the structure, an electrical conductive material is formed on a printed substrate. A tab through-hole is provide to penetrate the electrical conductive material and printed substrate. A tab formed by bending a body of the bus bar enters the tab through-hole. A periphery of the tab and the electrical conductive material are interconnected by soldering. A stress-absorbing aperture or recess is provided in an insulation plate on which the body of the bus bar is mounted. The stress-absorbing aperture or recess can absorb an axial stress caused in the tab.

According to the above structure, it is possible to absorb an extension of the tab by sinking a lower end of the tab into the stress-absorbing aperture or recess formed in the insulation plate at the position immediately below the tab, when the tab extends during a current flowing. Consequently, it is possible to prevent the soldered portion between the tab and the electrical conductive material on the printed substrate from causing a stress and from causing cracks.

Furthermore, because the stress-absorbing aperture or recess can be formed at the same time of producing the insulation plate, it is possible to reduce a cost of production and to enhance a working efficiency.

[Effects of the Invention]

As described above, in the case where the tab of the bus bar intersects the electrical conductive material on the printed substrate in perpendicular to each other, because the stress-absorbing aperture or recess formed in the insulation plate at the position immediately below the tab absorbs a difference in coefficients of extension between the tab and the electrical conductive material when the flowing current generates heat, it is possible to avoid applying a stress to the soldered portion.

Consequently, a connector connection is not required and a simple soldering process can reduce a cost and a working process greatly.

DETAILED DESCRIPTION OF EXEMPLARY EMBODIMENTS

Figure 1:
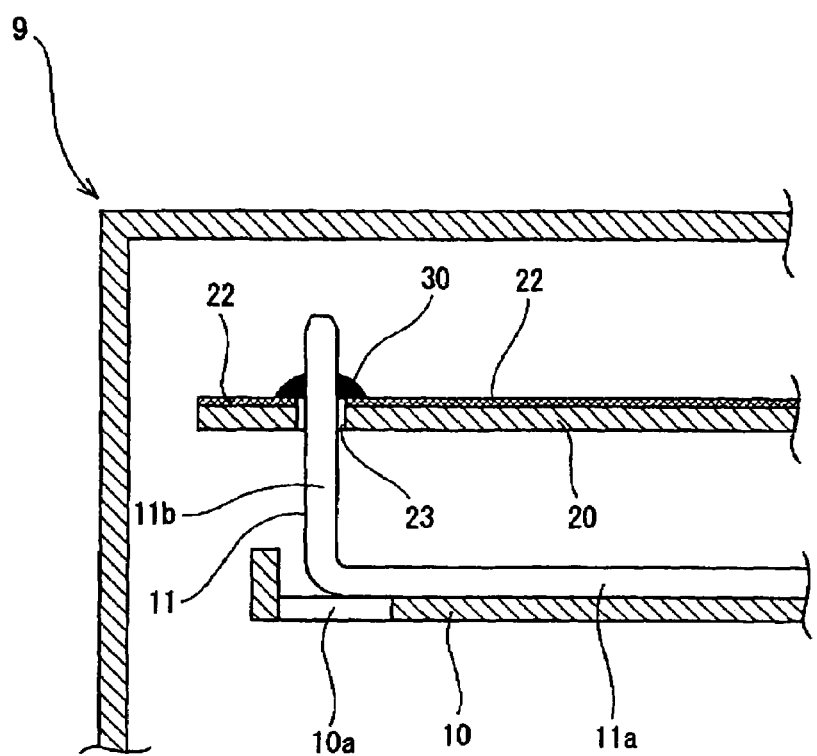
FIG. 1 is a sectional view of a main part of a first embodiment of a soldering structure between a tab of a bus bar and a printed substrate in accordance with the invention.

Referring now to the drawings, embodiments of a soldering structure between a tab of a bus bar and a printed substrate in accordance with the invention will be described below.

Figure 2:
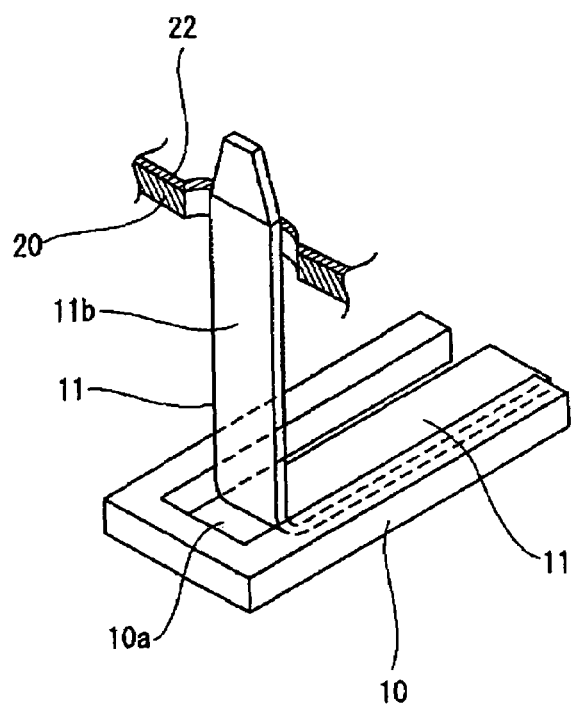
FIG. 2 is a perspective view of a main part of the soldering structure, illustrating an insulation plate, a bus bar, and a printed substrate.

FIGS. 1 and 2 show a first embodiment of a soldering structure between a tab of a bus bar and a printed substrate in accordance with the invention. A bus bar 11 punched out from a brass plate is mounted on an insulation plate 10 in a horizontal direction and they are contained in an electrical junction box 9 to be mounted on an automobile vehicle. A printed substrate 20 is contained above the bus bar 11 in the electrical junction box 9. The bus bar 11 and printed substrate 20 are located in a layered manner in a vertical direction in the box 9.

A horizontal body 11*a* of the bus bar 11 is mounted on the insulation plate 10. A tab 11*b* is formed by bending an end of the body 11*a* upward. A stress-absorbing aperture 10*a* is provided in the insulation plate 10 immediately below a proximal end (lower end) of the tab 11*b*. The stress-absorbing aperture 10*a* extends longitudinally by a small distance from the position immediately below the proximal end of the tab 11*b*. Thus, when the tab 11*b* extends to insert the lower end of the tab 11*b* into the stress-absorbing aperture 10*a*, a part of the body 11*a* enters the aperture 10*a* while inclining the part. Consequently, the lower end of the tab 11 enters the stress-absorbing aperture 10*a* smoothly.

An electrical conductive material 22 is formed on an upper surface of the printed substrate 20 located above the bus bar 11. A tab through-hole 23 is formed previously in the printed substrate 20 and electrical conductive material 22 to receive an upper end of the tab 11*b*.

The upper end of the tab 11*b* passes the through-aperture 23 upward and a solder 30 interconnects an outer periphery of the tab 11*b* and a peripheral portion around the tab through-hole 23. The solder 30 is different from the tab 11*b* made of a brass plate with respect to coefficients of extension at a high temperature. That is, the coefficient of extension of the tab 11*b* is greater than that of the solder 30.

The printed substrate 20, on which the solder 30 interconnects the tab 11*b* and electrical conductive material 22, is secured by screws (not shown) to a casing or a partition in the electrical junction box at a room temperature. That is, a dimension of a space between the bus bar 11 and the printed substrate 20 is not set in consideration of an extension of the tab 11*b* at a high temperature but the printed substrate 20 is secured in the box 9 under a condition at a room temperature.

In the soldering structure between the tab 11*b* of the bus bar 11 and the electrical conductive material 22 on the printed substrate 20, as described above, when the bus bar 11 and tab 11*b* are heated during a current flowing and the tab 11*b* extends longitudinally (axially), because the printed substrate 20 and electrical conductive material 22 are located in a horizontal direction in the casing and they intersect the tab 11*b* in a vertical direction in the casing, the printed substrate 20 and electrical conductive material 22 hardly extends in the vertical direction in the casing. Consequently, a stress is caused in a connecting portion formed by the solder 30.

However, when the tab 11*b* extends longitudinally, the proximal (lower) end of the tab 11*b* extends downward and enters the stress-absorbing aperture 10*a* in the insulation plate 10, thereby absorbing the stress caused in the connecting portion formed by the solder 30, because the aperture 10*a* is located at the position immediately below the lower end of the tab 11*b*. Accordingly, it is possible to prevent the solder 30 from cracking due to a stress and to enhance reliability in electrical connection between the tab of the bus bar and the electrical conductive material in the ECU.

Figure 3:
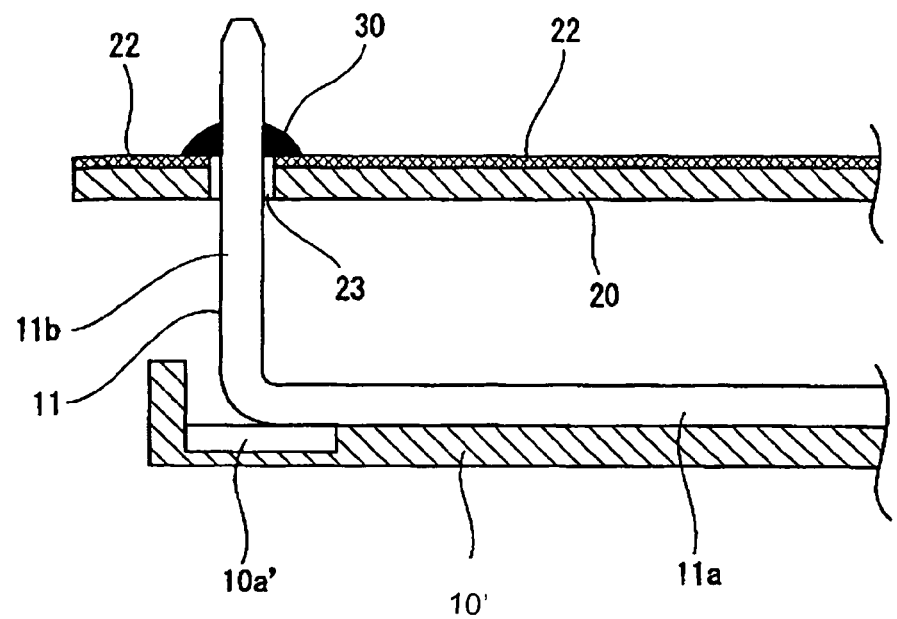
FIG. 3 is a sectional view of a main part of a second embodiment of a soldering structure between a tab of a bus bar and a printed substrate in accordance with the invention.
Figure 4:
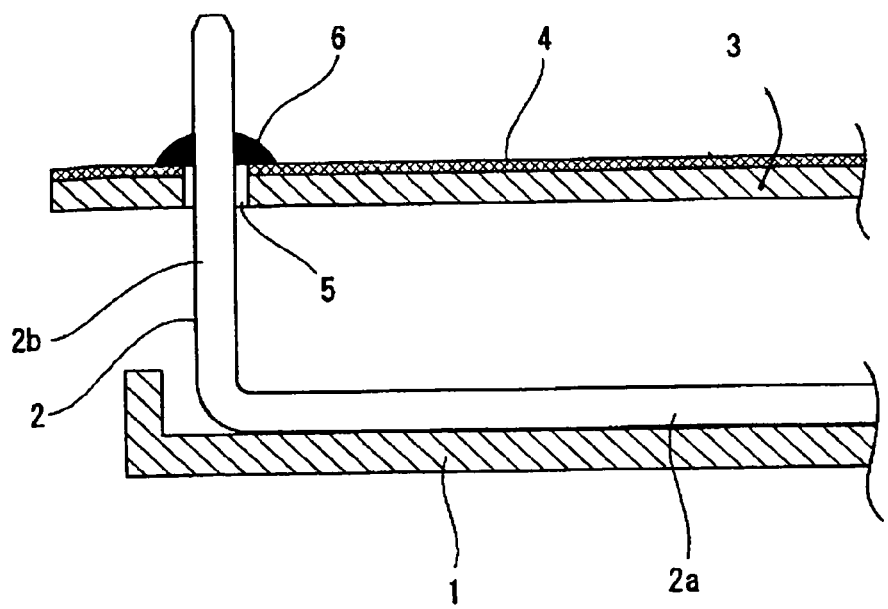
FIG. 4 is a sectional view of a main part of a conventional soldering structure between a tab of a bus bar and a printed substrate.

The invention is not limited to the first embodiment described above. For example, FIG. 3 shows a second embodiment of the invention. As shown in FIG. 3, a stress-absorbing recess 10*a'* may be provided in an insulation plate 10' at a position immediately below the tab 11*b* of the bus bar 11 in place of the stress-absorbing aperture 10*a* in the first embodiment. Because an extension amount of the tab 11*b* is minute during a current flowing, it is possible for the recess to absorb a stress, even if the insulation plate has a thin thickness.

Taking a heat radiation effect into consideration, it will be preferable to provide the stress-absorbing aperture 10*a* in the first embodiment in place of the stress-absorbing recess 10*a'* in the second embodiment.

It is possible to dispose the bus bar on an upper position in the casing, to project the tab downward, and to connect the tab to the printed substrate disposed on a lower position in the casing.

Although the invention has been described with reference to particular means, materials and exemplary embodiments, it is to be understood that the invention is not limited to the particulars disclosed and extends to all equivalents within the scope of the claims. It is evident that many alternatives, modifications, and variations will be apparent to those skilled in the art in light of the foregoing description. It is therefore contemplated that the appended claims will embrace any such alternatives, modifications, and variations as falling within the true scope and spirit of the invention.

What is claimed is:

1. A soldering structure between a bus bar and a printed substrate, comprising:
    an electrical conductive material formed on the printed substrate;
    a tab through-hole provided to penetrate the electrical conductive material and the printed substrate;
    a tab formed by bending a body of the bus bar that enters the tab through-hole, wherein a first periphery of the tab and a second periphery of the electrical conductive material are interconnected by soldering;
    an insulation plate on which the body of the busbar is mounted; and
    a rectangular-shaped stress-absorbing aperture disposed in the insulation plate immediately below a proximal end of the tab, wherein the stress-absorbing aperture absorbs an axial stress caused in the tab and prevents cracks in a soldered portion between the tab and the printed substrate.

* * * * *